United States Patent [19]

Yu

[11] Patent Number: 5,066,611
[45] Date of Patent: Nov. 19, 1991

[54] METHOD FOR IMPROVING STEP COVERAGE OF A METALLIZATION LAYER ON AN INTEGRATED CIRCUIT BY USE OF MOLYBDENUM AS AN ANTI-REFLECTIVE COATING

[75] Inventor: Chang Yu, Boise, Id.

[73] Assignee: Micron Technology, Inc., Boise, Id.

[21] Appl. No.: 575,942

[22] Filed: Aug. 31, 1990

[51] Int. Cl.$^5$ ............................................. H01L 21/26
[52] U.S. Cl. .................................... 437/173; 437/192; 437/194
[58] Field of Search ........................ 437/173, 192, 194

[56] References Cited

U.S. PATENT DOCUMENTS 4,758,533  7/1988  Magee et al. ....................... 437/173
4,800,179  1/1989  Mukai ................................. 437/195

FOREIGN PATENT DOCUMENTS 54-150080  11/1979  Japan .
57-198632  12/1982  Japan .
01-303404  12/1989  Japan .

OTHER PUBLICATIONS

Y. Lai et al., "The Use of Ti as an Antireflective Coating for Laser Planarization of Al ... " 6th International IEEE VLSI Multilevel Interconnect Conference, Cat. No. 89-TH0259-2, Jun. 12-13, 1989, p. 501.
R. Liu et al., "A Study of Pulsed Laser Planarization of Al ... ", 6th International IEEE VLSI Multilevel Interconnect. Conference, Cat. No. 89TH0259-2, Jun. 12-13, 1989 pp. 329-335.
D. B. Tuckerman et al., "Laser Planarization", Solid State Technology vol. 29, No. 4, Apr. 1986, pp. 129-134.

Primary Examiner—Brian E. Hearn
Assistant Examiner—Laura M. Holtzman
Attorney, Agent, or Firm—Wells, St. John & Roberts

[57] ABSTRACT

A method for improving step coverage of metallization layers of an aluminum alloy on an integrated circuit involves use of a deposited layer of molybdenum as an anti-reflective coating to increase the efficient use of laser energy for planarization purposes where the underlying aluminum alloy covers a step, such as an open contact hole or via.

6 Claims, 1 Drawing Sheet

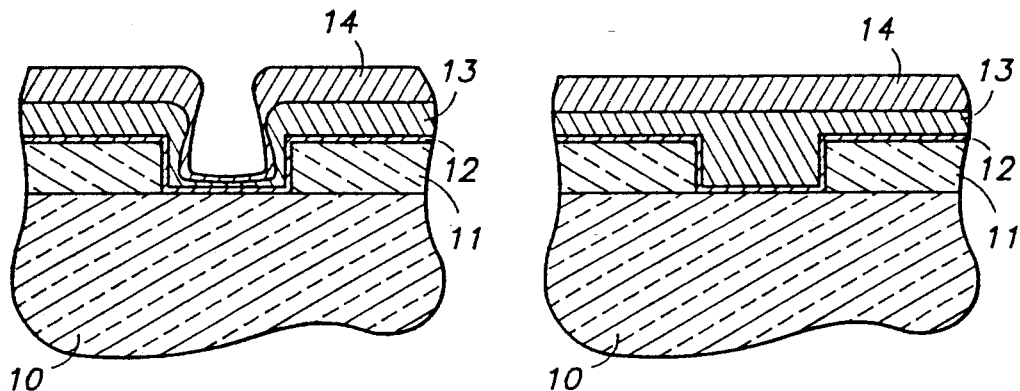
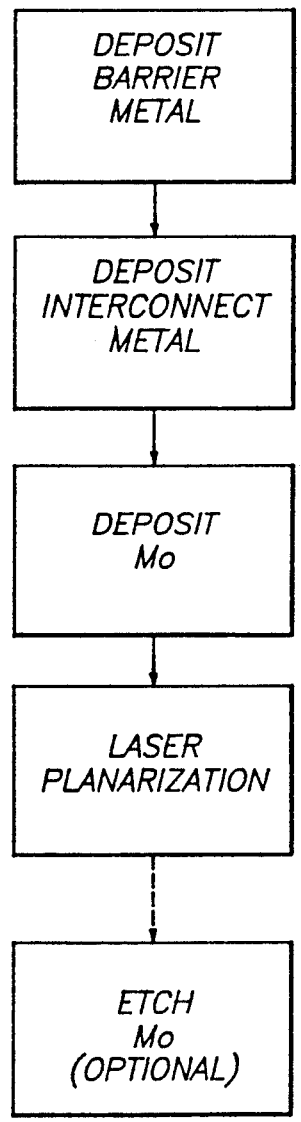

METHOD FOR IMPROVING STEP COVERAGE OF A METALLIZATION LAYER ON AN INTEGRATED CIRCUIT BY USE OF MOLYBDENUM AS AN ANTI-REFLECTIVE COATING

TECHNICAL FIELD

This disclosure relates to metallization of integrated circuits, particularly to improvements in laser planarization of deposited conductive metal film at steps and contact holes/vias about a covered surface on an integrated circuit die.

BACKGROUND OF THE INVENTION

In the metallization step utilized preparatory to etching of conductors about the outer surface of an integrated circuit, step-coverage of conductive metal films (typically aluminum alloys) is poor over surface discontinuities, such as recesses and contact holes/vias. Planarization of the conductive surface is particularly desirable when vias are stacked vertically in multilevel metallization.

Step coverage of film deposited conventionally by evaporation or sputtering becomes progressively worse as the dimensions of components on the integrated circuit shrink. The poor step coverage is a result of the shadow effect in the deposited film at the sidewalls of steps or holes.

The poor step coverage problem can be solved by selective chemical vapor deposition of tungsten, by metal deposition using high temperature and/or bias sputtering, or by supplemental metallic deposition, using multiple alternation sequences involving a combination of evaporation and resputtering. However, the surfaces resulting from these procedures are not planar.

The use of a pulsed laser to melt and planarize Al thin films to fill high aspect ratio contact vias is a very attractive approach to Ultra Large Scale Integrated (ULSI) circuit metallization. Laser planarization is a low thermal budget, simple, and effective technique for planarizing metal layers and filling interlevel contacts at the cost of only one additional step to the standard process flow. Excimer Laser planarization relies on a very short laser pulse to rapidly melt an absorbing metal layer. During the molten period, mass transport of the conductive metal occurs, which results in flow of the metal into contact holes/vias and drives the surface flat due to the high surface tension and low viscosity of molten metals.

Recently, the technique of laser planarization has shown promise in improving the step coverage of aluminum alloy films in micron/submicron geometry contacts and contact vias. However, due to the high reflectivity of aluminum (approximately 93% for wave lengths in the region down to 200 mm) and its relatively low evaporation temperature (2467° C.), aluminum alloys suffer from the following disadvantages: (1) inefficient use of laser energy, (2) low optical ablation limit, and (3) low process window between the ablation limit and the via-fill limit.

Planarization systems utilizing excimer laser irradiation show particular promise for filling submicron-diameter contact holes/vias and planarizing the resulting surface. Lessening of the surface reflectivity normally encountered in heating of aluminum alloys by laser energy has already been reported as widening the "process window" between the "ablation limit", or temperature at which the conductive metal boils or evaporates, and the "via-fill limit," or temperature at which sufficient flow of the conductive metal occurs to fill the circuit recesses.

A general discussion of laser planarization can be found in a paper titled "Interconnects on Integrated Circuits Improved by Excimer Laser Planarization for Multilevel Metallization" by Mukai, et al., pp. 101-107, i.e., VLSI Multilevel Interconnection Conference, Santa Clara, CA (1988), which is hereby incorporated into this disclosure by reference. It describes the use of a thin copper overcoating to enhance aluminum planarization processing by increasing the initial optical absorbance of the laser beam in the conductive metal film. The paper fails to address the low oxidation resistance and the recognized difficulty of etching copper coatings.

Use of titanium as an anti-reflective coating for laser planarization processes has also been proposed. However, reported improvements in planarization were achieved at the expense of several drawbacks, including high resistivity and stress. The higher resistivity of the Ti—Al alloys that result from this process diminishes the advantage of Al metallization over an alternative metallization scheme using chemical vapor deposited tungsten as the primary conductive medium. Moreover, the higher stresses in the Ti—Al alloys imposes reliability concerns such as adhesion, cracks and stress voiding. It has been therefore concluded that titanium is not a desirable anti-reflective coating for aluminum and aluminum alloys in metallization procedures.

Despite the shortcomings in presently-reported systems for laser planarization, the value of an anti-reflective coating in widening the process window has been concluded to be important and to have demonstrated usefulness in increasing the thickness of a layer of conductive metal across a step or via.

A search for alternative anti-reflective coatings has led to identification of molybdenum as a useful coating. Molybdenum film is proposed as an anti-reflective coating on aluminum alloys or other low boiling point metals used for metallization purposes. The addition of a molybdenum film prior to laser planarization results in more efficient use of laser energy, less ablation of the aluminum layer at a given optical fluence, and widening of the process window.

BRIEF DESCRIPTION OF THE DRAWINGS

The preferred embodiment of the invention is illustrated in the accompanying drawings, in which:

FIG. 1 is a diagrammatic cross-sectional view showing the initial metallization films;

FIG. 2 is a diagrammatic view of the films following laser planarization; and

FIG. 3 is a flow diagram of the steps carried out in this process.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

The use of excimer lasers to melt and planarize an aluminum alloy film used in the metallization of integrated circuits has been recognized as holding out possibilities of both improved step coverage and economical manufacturing of Very Large Scale integrated (VLSI) circuits. However, several difficulties are inherent in this technique: (1) aluminum and its alloys are highly reflective to light, down to approximately 200 nm, leading to inefficient use of the laser power directed to an aluminum film; (2) the low absorbance of aluminum and its alloys enhances localized ablation where surface irregularities and precipitates, such as silicon and copper, absorb more light than the areas surrounding them; and (3) the process window of ±6–8% for laser planarization of aluminum and its alloys is relatively narrow.

While reports have been published with respect to using copper and titanium as anti-reflective coatings (ARC) to solve these problems, the choice of these metals has apparently been dictated solely by their reflective qualities. The present improvements to these systems take into account not only the reflectivity of the coating metal, but also its electrical and thermal properties and resistance to oxidation. Resistance to oxidation is of particular importance because the processed wafer typically is exposed to air when moving from the planarization equipment to the next processing station.

The method of this invention is outlined in FIG. 3. Following the use of standard processes to produce an integrated circuit, the metallization steps first involve depositing a barrier metal by sputtering, in the conventional manner. The barrier metal can be any suitable metal or alloy, such as Ti:W or an aluminum alloy. Then the interconnect layer, which can be an aluminum alloy or other low boiling point metal (such as copper or copper alloys), is deposited in a covering film by sputtering or other conventional deposition processes suitable for the electrically conductive metal. Finally, a layer of molybdenum is deposited over the interconnect or conductive metal, using sputtering techniques, chemical vapor deposition, or other suitable known procedures.

The resulting physical structure at a through via is shown in FIG. 1, where the underlying substrate is designated by reference numeral 10. A covering insulating layer 11 overlies the semiconductor components (not shown). The exterior surface of the layer 11 and the exposed surfaces on substrate 10 are apertured to form a hole, which might be a contact hole or a via. The surfaces are covered by a barrier metal 12, such as an aluminum alloy or Ti:W, which serves both as a wetting layer and a diffusion barrier.

A covering layer of aluminum alloy 13 extends across the hole. The thickness of the aluminum alloy along the walls and bottom surface of the hole is relatively thin due to the shadow effect that occurs when coating a hole. The deposited layer of molybdenum is illustrated at 14.

The final step leading to covering of the hole is laser planarization. This is accomplished by directing optical pulse irradiation from an excimer laser onto the area of the via or contact hole. The pulsed laser beam is scanned across the whole wafer, causing absorption of the laser beam within the molybdenum coating and thereby heating it. The heat is then conducted into the underlying low temperature melting aluminum alloy 13. As shown in FIG. 2, this causes the aluminum alloy 13 to flow into the open hole, resulting in a relatively planar outer surface in the resulting laminate.

As the structure shown in FIG. 1 is subjected to laser irradiation, the layer of conductive metal 13 is melted. This is facilitated by the anti-reflective nature of the covering layer of molybdenum. The anti-reflective molybdenum, with respect to the laser energy wave lengths, widens the planarization process window by the resulting increase in efficient use of laser energy to melt the conductive metal and a lowering of the via-fill limit. This can be attributed to a combination of the reflective properties of molybdenum, as well as its resistance to oxidation, thermal conductivity and specific heat, without a proportional lowering of the ablation limit, which is attributable to the evaporation temperature of molybdenum.

At low laser energies, there will be little intermixing of the aluminum and molybdenum layers apart from the area of the filled via itself, where there will be significant homogenous mixing of aluminum and molybdenum. In most instances the outer molybdenum layer can remain on the underlying aluminum layer. The low electrical resistivity of Molybdenum insures that there is no significant increase in the resistivity of the Mo/Al alloy composite that might be formed.

At high laser energies, it is expected there will be significant mixing of molybdenum and aluminum throughout the irradiated area. The etching of Mo/Al alloy, which is less conventional, is an optional step in the method, to be utilized only as necessary for quality control reasons. For this reason, the use of low energy laser irradiation is preferred, to minimize mixing of the metals and to leave a layer of molybdenum that can be readily removed by conventional wet etching at the end of the process.

A summary of physical properties of molybdenum and a comparison of those properties with the corresponding properties of copper, titanium and aluminum, is listed in the following table, where $T_m$ is the melting temperature, $T_b$ is the boiling point or evaporation temperature, p is the electrical resistivity, K is the thermal conductivity, c is the specific heat, and R is the optical reflectivity. All data is taken from The Handbook of Physics and Chemistry.

| Element | $T_m$ (C) | $T_b$ (C) | Density (g/cm) | p (μohm-cm) | K (W/cmK) | c (cal/gK) | R (%) |
|---|---|---|---|---|---|---|---|
| Al | 660 | 2467 | 2.70 | 2.65 | 2.37 | 0.215 | 92.5 |
| Cu | 1083 | 2567 | 8.96 | 1.68 | 4.01 | 0.092 | 36.4 |
| Ti | 1660 | 3287 | 4.54 | 42.0 | 0.22 | 0.125 | 38.9 |
| Mo | 2617 | 4612 | 10.22 | 5.2 | 1.38 | 0.060 | 57.6 |

The advantages of this process over the previously described processes using anti-reflective coatings of copper or titanium are as follows:

(1) Compared with copper, molybdenum has a much better etchability, since copper is basically not etchable.

(2) Compared with titanium, molybdenum has a much lower electrical resistivity.

(3) The positioning of the molybdenum thin film on the surface of an underlying aluminum alloy raises the ablation limit of the laser planarization process due to the higher evaporation temperature of molybdenum in comparison to aluminum, titanium and copper.

(4) In contrast to aluminum, copper and titanium films, which are readily oxidized at room temperature, molybdenum has a high oxidation resistance.

(5) Since the aluminum film used for metallization purposes is highly reflective and has a melting point of 2050° C., a molybdenum coating over such a film will remain at least partially intact to prevent the underlying aluminum alloy from oxidizing, resulting in more efficient coupling between the laser energy and the aluminum alloy.

As a result of the listed advantages, the process window of the laser planarization system is improved by use of molybdenum with no degradation to the interconnect film quality and no added difficulty in the subsequent processing steps, such as etching, as compared to use of copper or titanium.

The high thermal conductivity of molybdenum (in comparison with Titanium) and its low specific heat insure a higher temperature rise at a given optical fluence and a more efficient heat transfer to the underlying aluminum alloy. In addition, the low electrical resistivity (5.2 ohm-cm) of molybdenum is ideal for VLSI metallization techniques because it insures low resistivity for any resulting molybdenum-aluminum alloy composites. The result is an increase in efficient use of laser energy to melt the conductive metal and a lowering of the via-fill limit, attributable to a combination of the reflective properties of molybdenum, as well as its resistance to oxidation, thermal conductivity and specific heat, without a proportional lowering of the ablation limit, which is attributable to the substantially higher boiling point or evaporation temperature of molybdenum in comparison to aluminum, titanium and copper.

To summarize, molybdenum has many advantages over titanium and copper as an anti-reflective coating. Its low optical reflectivity, low electrical resistivity, low heat capacity, and high melting and evaporation temperatures, high thermal conductivity and resistance of oxidation make it ideal as a choice for this purpose.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method for improving step coverage of a metallization layer comprising an aluminum alloy or other low boiling point or high optical reflectivity metal on an integrated circuit during production of micron/submicron geometry contacts, surface recesses, and/or contact vias, comprising the following sequential steps:

depositing a layer of electrically conductive metal over an integrated circuit assembly;

depositing a layer of molybdenum over the conductive metal; and subjecting the resulting laminate to laser planarization at a fluence level sufficient to melt the underlying conductive metal while using the layer of molybdenum as an anti-reflective coating, thereby widening the planarization process window by the resulting increase in efficient use of laser energy by absorption of such energy into the underlying conductive metal to melt the conductive metal and a lowering of the via-fill limit, attributable to a combination of the reflective properties of molybdenum, as well as its resistance to oxidation, thermal conductivity and specific heat, without a proportional lowering of the ablation limit, which is attributable to the evaporation temperature of molybdenum.

2. The method of claim 1 wherein the molybdenum is deposited by sputtering.

3. The method of claim 1 wherein the molybdenum is deposited by chemical vapor deposition.

4. The method of claim 1, further including the following additional sequential step:

removing the remaining molybdenum after the laser planarization step.

5. The method of claim 1 wherein the conductive metal is an aluminum alloy.

6. The method of claim 1, further including the following additional step:

depositing a layer of barrier metal upon the exposed outer surface of the integrated circuit prior to the depositing of the layer of electrically conductive metal.

* * * * *